United States Patent

Owens et al.

(10) Patent No.: US 7,209,252 B2
(45) Date of Patent: Apr. 24, 2007

(54) MEMORY MODULE, PRINTER ASSEMBLY, AND METHOD FOR STORING PRINTER CODE

(75) Inventors: Brian Keith Owens, Lexington, KY (US); Tung-Fu Hsieh, Hsinchu (TW)

(73) Assignee: Lexmark International, inc., Lexington, KY (US)

( * ) Notice: Subject to any disclaimer, the term of this patent is extended or adjusted under 35 U.S.C. 154(b) by 919 days.

(21) Appl. No.: 10/047,121

(22) Filed: Jan. 15, 2002

(65) Prior Publication Data

US 2003/0135687 A1    Jul. 17, 2003

(51) Int. Cl.
*G06F 3/12* (2006.01)

(52) U.S. Cl. .............. 358/1.15; 358/1.18; 711/101; 711/102; 711/103; 711/104; 711/115; 714/6; 365/185.29; 365/185.33

(58) Field of Classification Search ........... 358/1.15, 358/1.16

See application file for complete search history.

(56) References Cited

U.S. PATENT DOCUMENTS

| | | | |
|---|---|---|---|
| 4,542,452 A * | 9/1985 | Fukai et al. ............ 700/12 |
| 5,499,295 A | 3/1996 | Cooper | |
| 5,509,134 A | 4/1996 | Fandrich et al. | |
| 5,742,844 A | 4/1998 | Feldman | |
| 5,768,563 A * | 6/1998 | Porter et al. ........... 703/27 |
| 5,872,994 A | 2/1999 | Akiyama et al. | |
| 6,016,472 A * | 1/2000 | Ali ..................... 704/500 |
| 6,026,020 A | 2/2000 | Matsubara et al. | |
| 6,038,635 A | 3/2000 | Ideta | |
| 6,038,663 A | 3/2000 | Feldman | |
| 6,101,593 A | 8/2000 | Feldman | |
| 6,125,061 A | 9/2000 | Mitani | |
| 6,126,327 A * | 10/2000 | Bi et al. .............. 709/221 |
| 6,128,675 A | 10/2000 | Ko | |
| 6,250,827 B1 * | 6/2001 | Nojima et al. ......... 400/691 |
| 6,606,707 B1 * | 8/2003 | Hirota et al. .......... 713/172 |

OTHER PUBLICATIONS

Description of Atmel AT45DB011 Serial DataFlash (Jan. 2001).

* cited by examiner

*Primary Examiner*—Twyler M. Lamb
*Assistant Examiner*—Robert N. Kang
(74) *Attorney, Agent, or Firm*—Douglas Erickson

(57) ABSTRACT

A memory module, a printer assembly, and a method for storing a computer code for a printer-controller application specific integrated circuit (ASIC) having a non-ROM memory control. The memory module has ROM memory cells and a non-ROM to ROM interface operatively connected to the ROM memory cells. The printer assembly has the above-described ASIC, the above-described memory module, and a transmission cable operatively connected to the non-ROM memory control of the ASIC and the non-ROM to ROM interface of the memory module. The method stores non-final versions of the computer code in a memory module having non-ROM memory cells, which allows the code to be changed during development, and stores the final version of the computer code in the above-described memory module having the ROM memory cells.

5 Claims, 1 Drawing Sheet

MEMORY MODULE, PRINTER ASSEMBLY, AND METHOD FOR STORING PRINTER CODE

TECHNICAL FIELD

The present invention relates generally to computers, and more particularly to a memory module, to a printer assembly, and to a method for providing computer code for a printer controller.

BACKGROUND OF THE INVENTION

Printers include those printers having a printer-controller application specific integrated circuit (ASIC) which includes a serial Flash memory control. A Flash memory module has Flash memory cells and a serial Flash interface operatively connected to the Flash memory cells. A transmission cable has separate transmission lines for a Flash clock, a Flash serial input, a Flash serial output, a Flash chip select, and a Flash reset signal. The transmission cable connects the serial Flash memory control of the printer-controller ASIC with the serial Flash interface of the Flash memory module. A Flash memory module is a type of erasable programmable read only memory (EPROM). EPROM memory modules (such as Flash memory modules) are nonvolatile computer memories which may have their programmed computer code erased, which are re-programmable, and which retain their programmed computer code when power is shut off to the computer or to the computer device (i.e., a device, such as a printer, which contains its own computer). EPROM memory modules are distinguished from ROM (read only memory) memory modules which cannot have their programmed computer code erased and which are not re-programmable, but which do retain their programmed computer code when power is shut off. By having the printer-controller ASIC set up (through its serial flash memory control) to communicate with a more costly Flash memory module, instead of set up (through a ROM memory control) to communicate with a less expensive ROM memory module, the programmed computer code can be changed during product development to correct programming errors found during printer testing, to update program capabilities before product introduction, etc.

What is needed is a memory module useful, for example, in a printer assembly, which may be employed, for example, in an improved method for storing computer code for a printer-controller ASIC of the printer assembly.

SUMMARY OF THE INVENTION

A first expression of a first embodiment of the invention is for a memory module. The memory module includes read-only-memory (ROM memory) cells and a non-ROM to ROM interface operatively connected to the ROM memory cells. In one example, the non-ROM to ROM interface is a serial Flash to ROM interface.

A second expression of a first embodiment of the invention is for a printer assembly. The printer assembly includes a printer-controller application specific integrated circuit (ASIC), a memory module, and a transmission cable. The printer-controller ASIC has a non-ROM memory control. The memory module includes read-only-memory (ROM memory) cells and a non-ROM to ROM interface operatively connected to the ROM memory cells. The transmission cable is operatively connected to the non-ROM memory control of the printer-controller ASIC and the non-ROM to ROM interface of the memory module. In one example, the non-ROM memory control is a serial Flash memory control, and the non-ROM to ROM interface is a serial Flash to ROM interface.

A first method of the invention is for storing a computer code for a printer-controller application specific integrated circuit (ASIC) having a non-ROM memory control. The method includes steps a) and b). Step a) includes storing non-final versions of the computer code in a first memory module, wherein the first memory module has non-ROM memory cells and a non-ROM interface, and wherein the non-ROM interface is operatively connected to the non-ROM memory control of the printer-controller ASIC and to the non-ROM memory cells of the first memory module. Step b) includes storing the final version of the computer code in a second memory module, wherein the second memory module has a non-ROM to ROM interface and ROM memory cells, wherein the non-ROM to ROM interface is operatively connected to the non-ROM memory control of the printer-controller ASIC and to the ROM memory cells of the second memory module, and wherein the second memory module physically replaces the first memory module. In one example, the non-ROM memory control of the printer-controller ASIC is a serial Flash memory control, the first memory module has Flash memory cells and a serial Flash interface, and the second memory module has a serial Flash to ROM interface.

Several benefits and advantages are derived from one or more of the first method and the first and second expressions of the first embodiment of the invention. In one example of a printer assembly application of the invention, using a Flash memory module for a printer-controller ASIC while developing the computer code for the ASIC allows the programmed computer code stored in the Flash memory module to be changed to correct programming errors found during printer testing, to update program capabilities before product introduction, etc. Then, using a memory module having ROM memory cells and a Flash to ROM interface, in place of the Flash memory module, to store the developed computer code for the printer-controller ASIC provides a cost advantage for the released printer by using the same printer-controller ASIC with a less costly memory module.

DETAILED DESCRIPTION

Figure 1:
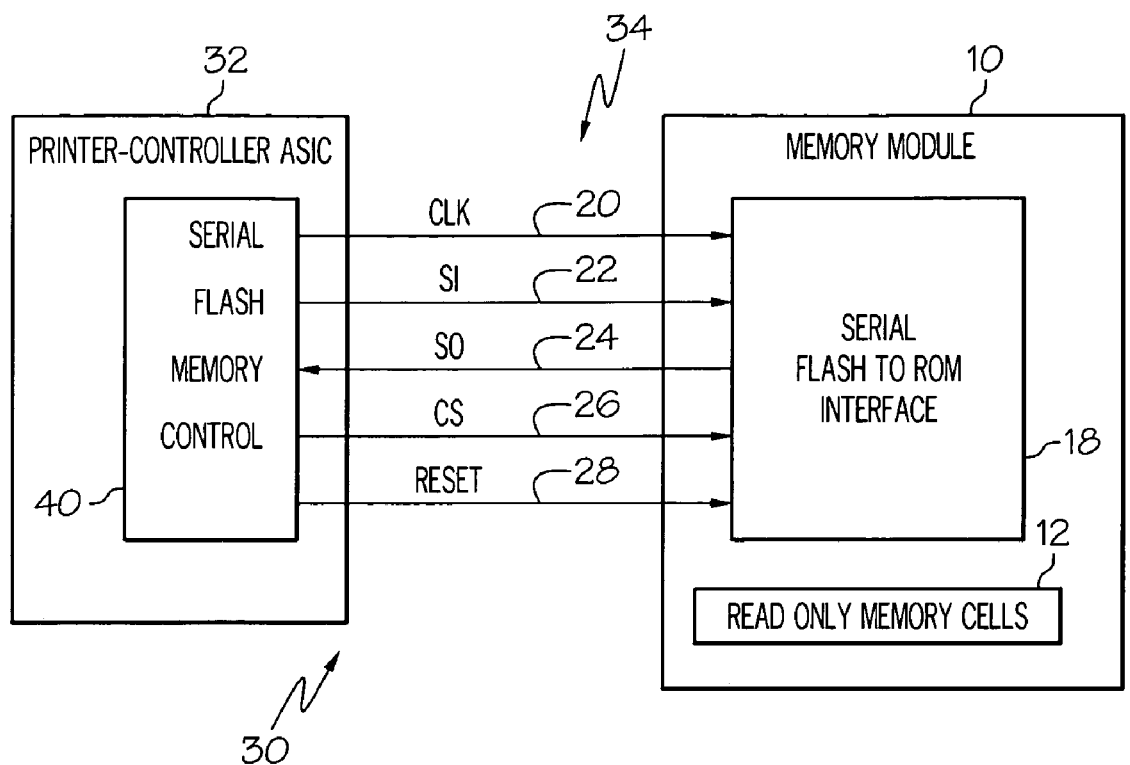
FIG. 1 is a block diagram of a first embodiment of the invention illustrating a memory module and a printer assembly which includes the memory module.

FIG. 1 illustrates a first embodiment of the invention. A first expression of the first embodiment is for a memory module 10. The memory module 10 includes read only memory (ROM memory) cells 12 and a non-ROM to ROM interface (such as an erasable programmable read only memory [EPROM] to ROM interface such as a Flash to ROM interface 18) operatively connected to the ROM memory cells 12. In one application, the memory module 10 is used in a computer device having a non-ROM memory control which expects to communicate with a corresponding non-ROM memory module.

In one modification, the Flash to ROM interface 18 is a serial interface. In one implementation, the Flash to ROM interface 18 has connections for a Flash clock transmission line 20 (labeled as CLK), a Flash serial input transmission line 22 (labeled as SI), a Flash serial output transmission line 24 (labeled as SO), a Flash chip select transmission line 26 (labeled as CS), and a Flash reset transmission line 28 (labeled as RESET). During operation of the Flash serial input transmission line 22, the Flash serial input transmission line 22 transmits a command selected from the group consisting of a status (i.e., status read) command, a read (i.e., data read) command, and a write (i.e., data write) command to the Flash to ROM interface 18. In one design, the Flash to ROM interface 18 passes through the status and read commands to the ROM memory cells 12 but only indicates a ready status without passing through the write command to the ROM memory cells 12.

A discussion of a first enablement of the memory module 10 is given in this and following paragraphs. In the first enablement of the memory module 10, the ROM memory cells 12 have 1,081,344 bits of memory organized as 512 pages of 264 bytes each. The memory module 10 uses a serial Flash to ROM interface 18 to sequentially access the data in the ROM memory cells 12. The simple serial interface facilitates hardware layout, increases system reliability, minimizes switching noise, and reduces package size and active pin count. The memory module 10 is enabled through the chip select pin (CS) and accessed via a three-wire interface consisting of the Serial Input (SI), Serial Output (SO), and the Serial Clock (CLK).

The memory module 10 is controlled by a list of instructions and their associated operation codes (opcodes). A valid instruction starts with the falling edge of CS followed by the appropriate 8-bit opcode and main memory address location. While the CS pin is low, toggling the CLK pin controls the loading of the opcode and main memory address location through the SI (serial input) pin. All instructions, addresses, and data are transferred with the most significant bit (MSB) first.

By specifying the appropriate opcode, data can be read from the main memory. A main memory read allows the user to read data directly from the 512 pages in the main memory. To start a page read, the 8-bit read opcode is followed by 24 address bits and 32 don't care bits. The 32 don't care bits which follow the 24 address bits are sent to initialize the read operation. Following the 32 don't care bits, additional pulses on CLK result in serial data being output on the SO (serial output) pin. The CS pin must remain low during the loading of the opcode, the address bits, and the reading of data. When the end of a page in main memory is reached during a main memory page read, the memory module 10 will continue reading at the beginning of the same page. A low to high transition on the CS pin will terminate the read operation and tri-state the SO pin.

The status register can be used to determine the device's ready status, the special ID. To read the status register, an appropriate opcode must be loaded into the device. After the last bit of the opcode is shifted in, the eight bits of the status register, starting with the MSB (bit 7), will be shifted out on the SO pin during the next eight clock cycles. The most-significant bit of the status register will be always set to "1", which means this device is already "ready". After bit 0 of the status register has been shifted out, the sequence will repeat itself (as long as CS remains low and CLK is being toggled) starting again with bit 7. The data in the status register is the same, so each repeating sequence will output the same value. The user can continuously poll bit 7 of the status register by stopping SCK once bit 7 has been output.

The memory module 10 has a reset function that causes any operation currently in progress to be terminated and forces the device's internal state machine into an idle state. The reset function is activated by holding the device's RESET pin LOW. This feature can be used as a safeguard against system power glitches or when the system supply monitor circuitry detects the supply voltage going below the minimum operating limit. Resetting the memory module 10 during these operating conditions prevents any erroneous operations which could result in data corruption. The reset circuit of the memory module 10 operates the same as the reset circuit of a Flash memory module. All interface lines of the memory module 10 have identical timing and voltage levels as a typical serial Flash memory module.

If the memory module 10 is reset before the completion of a page read operation, then the data in the page being read cannot be guaranteed. The memory module 10 must finish the entire operation in order for all data in the page to be valid. If the user wants to ensure that a valid read operation has been performed before resetting the memory module 10, then the system must poll the status register to determine the completion of the read operation. The read commands can be done in both block and segment form.

When power is first applied to the memory module 10, or when recovering from a reset condition, the SO pin will be in a high impedance state, and a high to low transition on the CS pin will be required to start a valid instruction.

The serial Flash to ROM interface 18 allows all valid read and status commands sent to the ROM memory cells 12 to execute exactly the same as if the memory module were a Flash memory module having Flash memory cells. The serial Flash to ROM interface 18 accepts write commands, but obviously cannot update the data stored in the ROM memory cells 12. The communication for a write command will be done the same as if the memory module 10 were a Flash memory module, including updating the status registers. Normally after a write to a Flash memory module, the status register will be read to ensure that the data was stored properly and there are no errors in the transmission. In the memory module 10, the status register will be updated as though a valid write to a Flash memory module had occurred.

It is noted that a particular construction of the first enablement of the memory module 10, including its serial Flash to ROM interface 18, to perform the particular above-described functions is left to the artisan and is within the routine design activities of computer memory chip providers and others skilled in the art.

A second expression of the first embodiment of the invention of FIG. 1 is for a printer assembly 30. The printer assembly 30 includes a printer-controller ASIC 32, a memory module 10, and a transmission cable 34. The printer-controller ASIC 32 has a non-ROM memory control (such as an EPROM memory control such as a Flash memory control 40. The memory module 10 includes ROM memory cells 12 and a non-ROM to ROM interface (such as an erasable programmable read only memory [EPROM] to ROM interface such as a Flash to ROM interface 18 operatively connected to the ROM memory cells 12. The transmission cable 34 is operatively connected to the non-ROM memory control 36 of the printer-controller ASIC 32 and the non-ROM to ROM interface 14 of the memory module 10.

In one example, the non-ROM memory control 36 of the printer-controller ASIC 32 is an EPROM memory control 38, and the non-ROM to ROM interface 14 is an EPROM to ROM interface 16. In one variation, the EPROM memory control 38 of the printer-controller ASIC 32 is a Flash memory control 40, and the EPROM to ROM interface is a Flash to ROM interface 18. In one modification, the Flash memory control 40 is a serial memory control, and the Flash to ROM interface 18 is a serial interface. The serial Flash to ROM interface makes it appear to the printer-controller ASIC that a Flash memory module (having a serial Flash interface and Flash memory cells) is attached to the serial Flash memory control of the printer-controller ASIC when in reality the memory module 10 (having the serial Flash to ROM interface and the ROM memory cells) is attached to the serial Flash memory control of the printer-controller ASIC. In one implementation, the transmission cable 34 includes a Flash clock transmission line 20, a Flash serial input transmission line 22, a Flash serial output transmission line 24, a Flash chip select transmission line 26, and a Flash reset transmission line 28. During operation of the printer-controller ASIC 32, the Flash control 40 transmits through the Flash serial input transmission line 22 a command selected from the group consisting of a status command, a read command, and a write command to the Flash to ROM interface 18. In one design, the Flash to ROM interface 18 passes through the status and read commands to the ROM memory cells 12 but only indicates a ready status without passing through the write command to the ROM memory cells 12.

As can be appreciated by the artisan, use of the memory module 10 is not limited to a printer-controller ASIC, and the memory module 10 is usable in any computer device having a non-ROM memory control.

Figure 2:
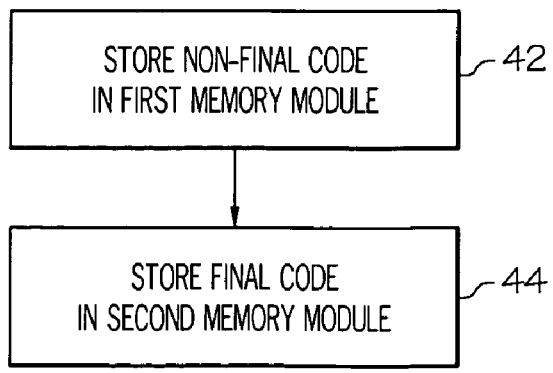
FIG. 2 is a flow chart of a first method of the invention for storing a computer code for a printer-controller ASIC.

A first method of the invention is for storing a computer code for a printer-controller ASIC 32 having a non-ROM memory control and is shown in FIG. 2. The first method includes steps a) and b). Step a) is labeled in block 42 of FIG. 2 as "Store Non-Final Code In First Memory Module". Step a) includes storing non-final versions of the computer code in a first memory module, wherein the first memory module has non-ROM memory cells and a non-ROM interface, and wherein the non-ROM interface is operatively connected to the non-ROM memory control of the printer-controller ASIC 32 and to the non-ROM memory cells of the first memory module. Step b) is labeled in block 44 of FIG. 2 as "Store Final Code In Second Memory Module". Step b) includes storing the final version of the computer code in a second memory module (such as memory module 10), wherein the second memory module has a non-ROM to ROM interface and ROM memory cells (such as ROM memory cells 12), wherein the non-ROM to ROM interface is operatively connected to the non-ROM memory control of the computer-controller ASIC 32 and to the ROM memory cells of the second memory module, and wherein the second memory module physically replaces the first memory module.

In one example, the non-ROM memory control of the printer-controller ASIC 32 is an EPROM memory control, the first memory module has EPROM memory cells and an EPROM interface, and the second memory module has an EPROM to ROM interface. In one variation, the EPROM memory control of the ASIC 32 is a Flash memory control 40, the first memory module has Flash memory cells and a Flash interface, and the second memory nodule has a Flash to ROM interface. In one modification, the Flash memory control 40 is a serial memory control, the Flash interface of the first memory module is a serial interface, and the Flash to ROM interface of the second memory module is a serial interface. In one implementation, the Flash to ROM interface has connections for a Flash clock transmission line 20, a Flash serial input transmission line 22, a Flash serial output transmission line 24, a Flash chip select transmission line 26, and a Flash reset transmission line 28. During operation of the Flash serial input transmission line 22, the Flash serial input transmission line 22 transmits a command selected from the group consisting of a status command, a read command, and a write command to the Flash to ROM interface 18. In one design, the Flash to ROM interface passes through the status and read commands to the ROM memory cells but only indicates a ready status without passing through the write command to the ROM memory cells.

Several benefits and advantages are derived from one or more of the first method and the first and second expressions of the first embodiment of the invention. In one example of a printer assembly application of the invention, using a Flash memory module for a printer-controller ASIC while developing the computer code for the ASIC allows the programmed computer code stored in the Flash memory module to be changed to correct programming errors found during printer testing, to update program capabilities before product introduction, etc. Then, using a memory module having ROM memory cells and a Flash to ROM interface, in place of the Flash memory module, to store the developed computer code for the printer-controller ASIC provides a cost advantage for the released printer by using the same printer-controller ASIC with a less costly memory module.

The foregoing description of a method and several expressions of an embodiment of the invention has been presented for purposes of illustration. It is not intended to be exhaustive or to limit the invention to the precise methods disclosed, and obviously many modifications and variations are possible in light of the above teaching. It is intended that the scope of the invention be defined by the claims appended hereto.

What is claimed is:

1. A method for storing computer code for a printer-controller application specific integrated circuit (ASIC) having a non-ROM memory control comprising the steps of:
   a) storing non-final versions of the computer code in a first memory module, wherein the first memory module has non-ROM memory cells and a non-ROM interface, and wherein the non-ROM interface is operatively connected to the non-ROM memory control of the printer-controller ASIC and to the non-ROM memory cells of the first memory module; and
   b) storing the final version of the computer code in a second memory module, wherein the second memory module has a non-ROM to ROM interface and ROM memory cells, wherein the non-ROM to ROM interface is operatively connected to the non-ROM memory control of the printer-controller ASIC and to the ROM memory cells of the second memory module, and wherein the second memory module physically replaces the first memory module, and
   wherein the non-ROM memory control of the printer-controller ASIC is a EPROM memory control, wherein the first memory module has EPROM memory cells and an EPROM interface, and wherein the second memory module has an EPROM to ROM interface.

2. The method of claim 1, wherein the EPROM memory control of the printer-controller ASIC is a Flash memory control, wherein the first memory module has Flash memory cells and a Flash interface, and wherein the second memory module has a Flash to ROM interface.

3. The method of claim 2, wherein the Flash memory control of the printer-controller ASIC is a serial memory control, wherein the Flash interface of the first memory module is a serial interface, and wherein the Flash to ROM interface of the second memory module is a serial interface.

4. The method of claim 3, wherein the Flash to ROM interface has connections for a Flash clock transmission line, a Flash serial input transmission line, a Flash serial output transmission line, a Flash chip select transmission line, and a Flash reset transmission line, and wherein, during operation of the Flash serial input transmission line, the Flash serial input transmission line transmits a command selected from the group consisting of a status command, a read command, and a write command to the Flash to ROM interface.

5. The method of claim 4, wherein the Flash to ROM interface passes through the status and read commands to the ROM memory cells but only indicates a ready status without passing through the write command to the ROM memory cells.

* * * * *